(12) United States Patent
Mooney

(10) Patent No.: US 7,086,754 B2
(45) Date of Patent: Aug. 8, 2006

(54) LIGHT REFLECTOR AND BARRIER FOR LIGHT EMITTING DIODES

(75) Inventor: Douglas J. Mooney, Livermore, CA (US)

(73) Assignee: Brocade Communications Systems, Inc., San Jose, CA (US)

( * ) Notice: Subject to any disclaimer, the term of this patent is extended or adjusted under 35 U.S.C. 154(b) by 0 days.

(21) Appl. No.: 10/698,336

(22) Filed: Oct. 31, 2003

(65) Prior Publication Data

US 2005/0094392 A1    May 5, 2005

(51) Int. Cl.
    *F21V 1/00*    (2006.01)
(52) U.S. Cl. .................. 362/241; 362/240; 362/247; 362/248; 362/297; 362/346
(58) Field of Classification Search ................. 362/241, 362/247, 248, 240, 85, 28, 29, 23, 297, 346; 361/683, 816
    See application file for complete search history.

(56) References Cited

U.S. PATENT DOCUMENTS

| | | | | |
|---|---|---|---|---|
| 3,966,303 | A | * | 6/1976 | Yamamoto .................... 349/62 |
| 5,008,658 | A | * | 4/1991 | Russay et al. ................ 345/87 |
| RE34,254 | E | * | 5/1993 | Dragoon ..................... 362/307 |
| 5,387,901 | A | * | 2/1995 | Hardt ..................... 340/815.42 |
| 5,790,041 | A | * | 8/1998 | Lee ....................... 340/815.45 |
| 6,183,100 | B1 | * | 2/2001 | Suckow et al. ............... 362/35 |
| 6,229,713 | B1 | * | 5/2001 | Schmitt et al. ............. 361/818 |
| 6,685,351 | B1 | * | 2/2004 | Chen ......................... 362/555 |

\* cited by examiner

*Primary Examiner*—Thomas M. Sember
*Assistant Examiner*—Adam C. Rehm
(74) *Attorney, Agent, or Firm*—Wong, Cabello, Lutsch, Rutherford & Brucculeri, LLP

(57) ABSTRACT

A light barrier and/or light reflector for PCB-mounted LED's has reflective walls defining interior chambers which redirect the light from the LED's in a substantially orthogonal direction and shield each LED from the light emitted by adjacent LED's. The device is particularly suited for redirecting light from LED's on a PCB to a status indicator panel thereby replacing conventional light pipes.

21 Claims, 4 Drawing Sheets

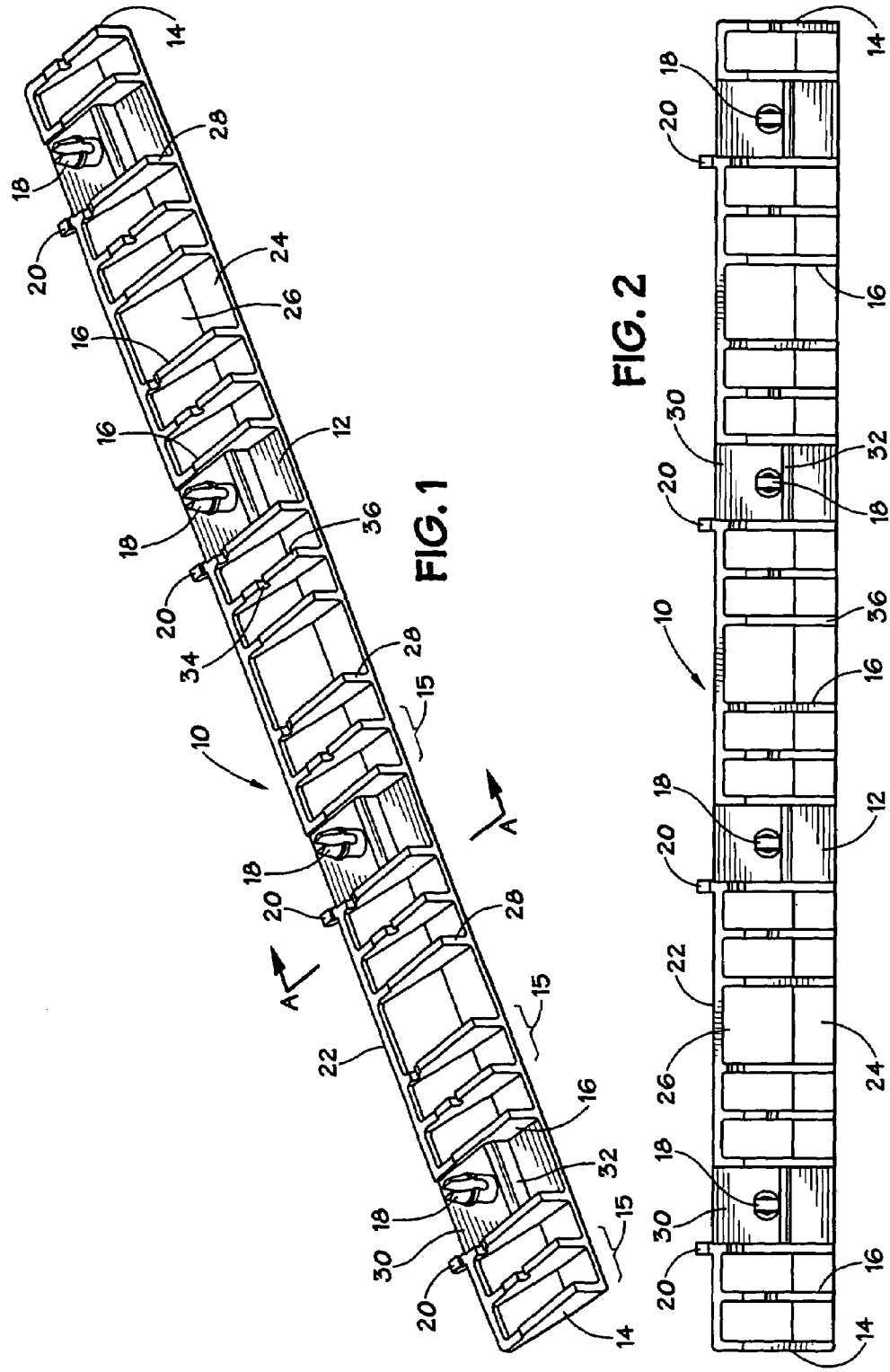

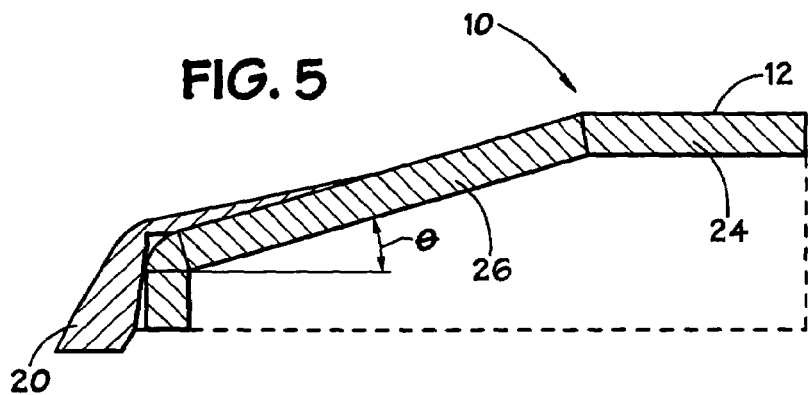
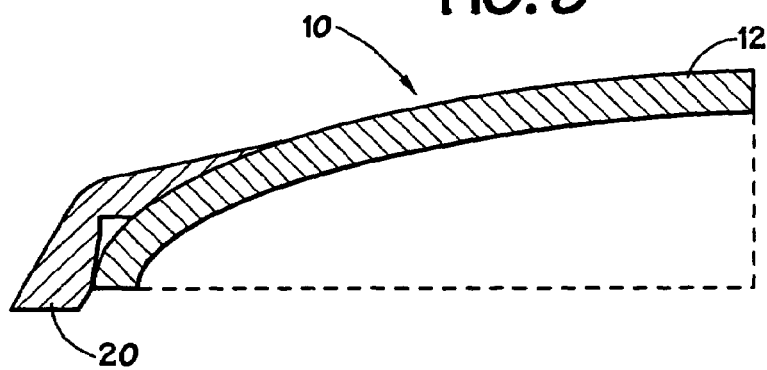

LIGHT REFLECTOR AND BARRIER FOR LIGHT EMITTING DIODES

BACKGROUND

1. Field of the Invention

This invention relates to light barriers or shields. More particularly, it relates to devices for directing and shielding the light from light emitting diodes (LED's) that are mounted on printed circuit boards (PCB's).

2. Description of the Related Art

LED's are particularly suited for use as status indicators for various electronic circuits and systems. They are small, relatively inexpensive, have modest power requirements, produce little heat and have a long working life. LED's are available from a variety of sources in packages which permit direct mounting to a printed wiring board (PWB). However, since a PWB or PCB is typically mounted within a chassis of some sort, LED's on the PCB are usually not directly viewable by the user of the device.

In the past, light pipes comprised of rods or bundles of fibers of clear plastic or glass have been used to direct the light from PCB-mounted LED's to lenses or windows on, for example, the front panel of an electronic device where they may be viewed by the user. However, there are a number of disadvantages associated with this system: the light pipes must be aligned with both the LED and the viewing lens or window; and, the light from adjacent LED's can "bleed over" into an adjoining light pipe producing indefinite indications to the user. Moreover, light pipes are relatively costly and labor-intensive to install. The present invention solves these problems in a particularly efficient and cost-effective way.

SUMMARY OF THE INVENTION

A combination light barrier and reflector comprising individual "compartments", "chambers", "cavities", "wells" or "pockets" is designed to fit over PCB-mounted LED's and redirect the light from such LED's in an orthogonal direction to lenses or windows on a nearby panel.

In one embodiment, the invention comprises a one-piece, plastic unit with an angled top and partition walls defining compartments which accommodate LED's that may be mounted on a printed circuit board. The partition walls are preferably opaque and substantially prevent light from one LED from entering an adjacent compartment. The angled top portion of the unit reflects the light from the LED to a status panel in proximity to the PCB containing the LED's. The status panel may comprise lenses or windows for viewing the light from the LED's and the partition walls of the light barrier may be further configured to shield the lenses or windows on the status panel from extraneous light.

The light barrier may be fabricated by the injection molding of a thermoplastic resin and may optionally be equipped with snap-in type mounting studs for quick and easy attachment to a printed circuit board.

BRIEF DESCRIPTION OF THE DRAWINGS

FIG. 1 is a perspective view of one embodiment of the light barrier showing the underside of the device.

FIG. 2 is a bottom plan view of the embodiment shown in FIG. 1.

FIG. 5 is a cross sectional view of the embodiment illustrated in FIG. 1 taken along line A—A

FIG. 8 is a cross sectional view of an alternate embodiment.

DETAILED DESCRIPTION

Figure 3:
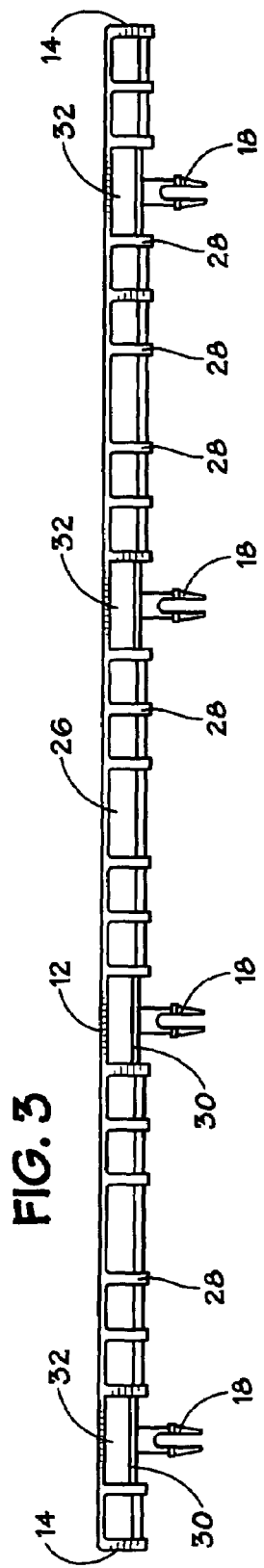
FIG. 3 is a front view of the embodiment illustrated in FIG. 1.

FIG. 1 illustrates in perspective view one particular embodiment of the invention which hereinafter may be referred to as a "light barrier" or a "light reflector" or a "barrier/reflector". The light barrier 10 illustrated in FIG. 1 is adapted for mounting to a printed circuit board. The perspective view of FIG. 1 shows the surface which abuts the PCB and the front surface of the light barrier 10—i.e., the surface from which light is emitted. If the light barrier is mounted on the upper surface of a horizontal PCB, FIG. 1 may be considered a perspective view of the underside of light barrier 10 taken from the front side.

Light barrier 10 has segmented top 12 which comprise flat segment 24 and angled segment 26. End walls 14 connect top 12 to back wall 22. Interior walls 16 are attached to top 12 and back wall 22 to define compartments 15. Each compartment 15 is open on its bottom and front sides.

Interior walls 16 each comprise wall bottom 36 and wall front 28. Wall bottoms 36 are coplanar as are wall fronts 28. The plane of wall bottoms 36 is orthogonal to the plane of wall fronts 28 and defines the bottom surface of light barrier 10. FIG. 2 is a bottom plane view of light barrier 10. Similarly, the plane of wall fronts 28 defines the front surface of light barrier 10. FIG. 3 is a front plan view of light barrier 10. A wall bottom 36 may be provided with a notch 34 to accommodate a component lead on the PCB to which the light barrier 10 is mounted.

Figure 4:
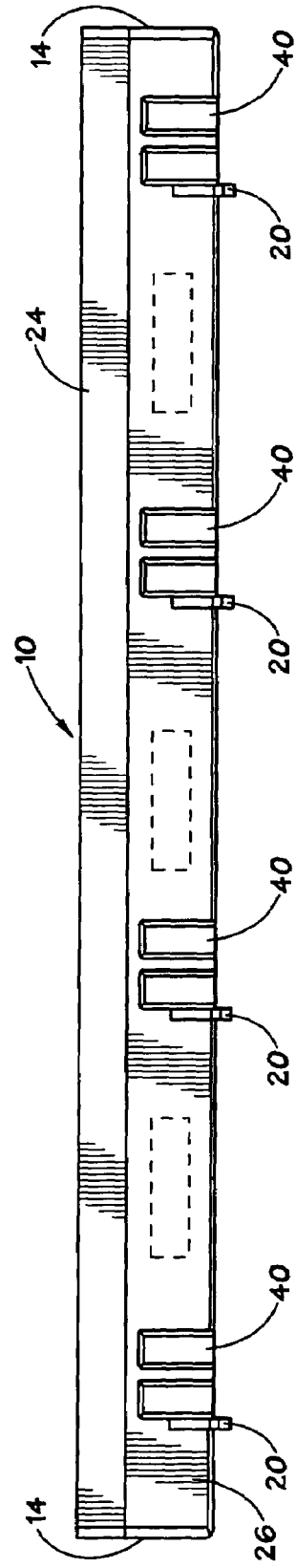
FIG. 4 is a top view of the embodiment illustrated in FIG. 1.

FIG. 4 is a top plan view of light barrier 10 showing mounting feet 20 and "core outs" 40 which may be used in some embodiments for molding purposes to maintain a consistent wall thickness.

Light barrier 10 is equipped with barbed mounting studs 18 for engaging corresponding holes in a receiving PCB. Studs 18 are attached to lands 30 which are connected via step portions 32 to top 12. The transverse cut or void in the mounting stud 18 allows the barbed portions to flex inward toward the center of the stud 18 during insertion into the mounting hole on the PCB and then to return to the extended position when the barb clears the hole on the opposite side of the PCB. The distance between the shoulder of the barb and the surface of land 30 may be chosen to accommodate the particular thickness of the PCB to which the light barrier is to be mounted. Mounting feet 20 may be provided along back wall 22 for engaging corresponding receivers on the PCB which, in some embodiments, may be 0.125" diameter holes in the PCB.

The surfaces of flat top segment 24, angled top segment 26, interior walls 16 and back wall 22 which face the interior of each chamber 15 are preferably reflective to visible light. To that end, it is desirable to have a smooth finish on these surfaces.

The light barrier of the present invention may be fabricated of any dimensionally stable, opaque material. For ease of manufacture and low cost, the light barrier may be formed by injection molding of a thermoplastic resin. One particularly suitable plastic is LEXAN® polycarbonate resin manufactured by GE Plastics.

It will be appreciated by those skilled in the art, that a material of high Lambertian reflectance is preferred—i.e., incoming light is partially absorbed and partially transmitted equally in all directions. For this reason, a white material may provide the greatest brightness to the viewer. However, it has surprisingly been found that even black plastic (which typically is the least expensive plastic resin) may be used to fabricate the light barrier if those portions of the mold producing the interior surfaces of the "pockets" are polished to a #3 finish or better.

A Lambertian surface is any surface whose radiance is independent of direction. Such a surface obeys Lambert's cosine law that states that the reflected or transmitted luminous intensity in any direction from an element of a perfectly diffusing surface varies as the cosine of the angle between that direction and the normal vector of the surface. As a consequence, the luminance of that surface is the same regardless of the viewing angle.

When a photon hits a rough surface, it rebounds in a direction not much related to its incoming direction. We talk here about the case where photons reflect in a statistically independent direction. This is called Lambertian reflection and applies to ray tracing with diffuse surfaces, or Monte-Carlo physics calculations. A lambertian surface is a surface of perfectly matte properties, which means that it adheres to Lambert's cosine law. Ideal diffuse reflectors are said to be Lambertian reflectors.

At the other extreme is mirror or specular reflection exhibited by shiny metal surfaces such as chrome, silver or pure aluminum. Specular reflectance obeys the law of reflection, where the angle of reflection equals the angle of incidence. It is most important to realize that although specular reflections produce a clear image in the surface of the material, the actual amount of light reflected may be deceptively low. A matt white painted surface, for instance, has a reflectance of 85% to 90% compared with only 60% specular reflectance from a polished stainless steel surface, while polished aluminum will be approximately 85%.

FIG. 5 is a cross-sectional view taken along line A—A in FIG. 1. In the particular embodiment illustrated, the angle $\theta$ between angled top segment 26 and flat top segment 24 is about 17.5°. The plane of flat segment 24 may be parallel to the plane of the printed circuit board to which the device is mounted.

In alternative embodiments, the top 12 of light barrier 10 may comprise any number of segments. It will be appreciated by those skilled in the art that as the number of segments increases, the profile of top 12 may approach that of a segment of a parabola.

In an alternative embodiment, as shown in FIG. 8, top 12 may be a portion of a parabola with the LED being positioned at approximately the focus of the parabola. A parabolic reflector or parabolic dish is a reflective device formed in the shape of a paraboloid of revolution. Parabolic reflectors can either collect or distribute energy such as light. The parabolic reflector functions due to the geometric properties of the paraboloid shape: if the angle of incidence to the inner surface of the collector equals the angle of reflection, then any incoming ray that is parallel to the axis of the dish will be reflected to a central point, or "focus". Similarly, energy radiating from the "focus" to the dish can be transmitted outward in a beam that is parallel to the axis of the dish. Accordingly, light from the LED striking the reflective parabolic surface 12 will be redirected out of the front of light reflector 10.

A Lambertian source is an optical source that obeys Lambert's cosine law, i.e., that has an intensity directly proportional to the cosine of the angle from which it is viewed. Conventional (surface-emitting) LEDs are approximately Lambertian. They have a large beam divergence. This results in a radiation pattern that resembles a sphere (or a hemi-sphere in the case of an SMT packaged LED). Thus, most of their total optical output is not coupled into optical fibers or light pipes.

Figure 6:
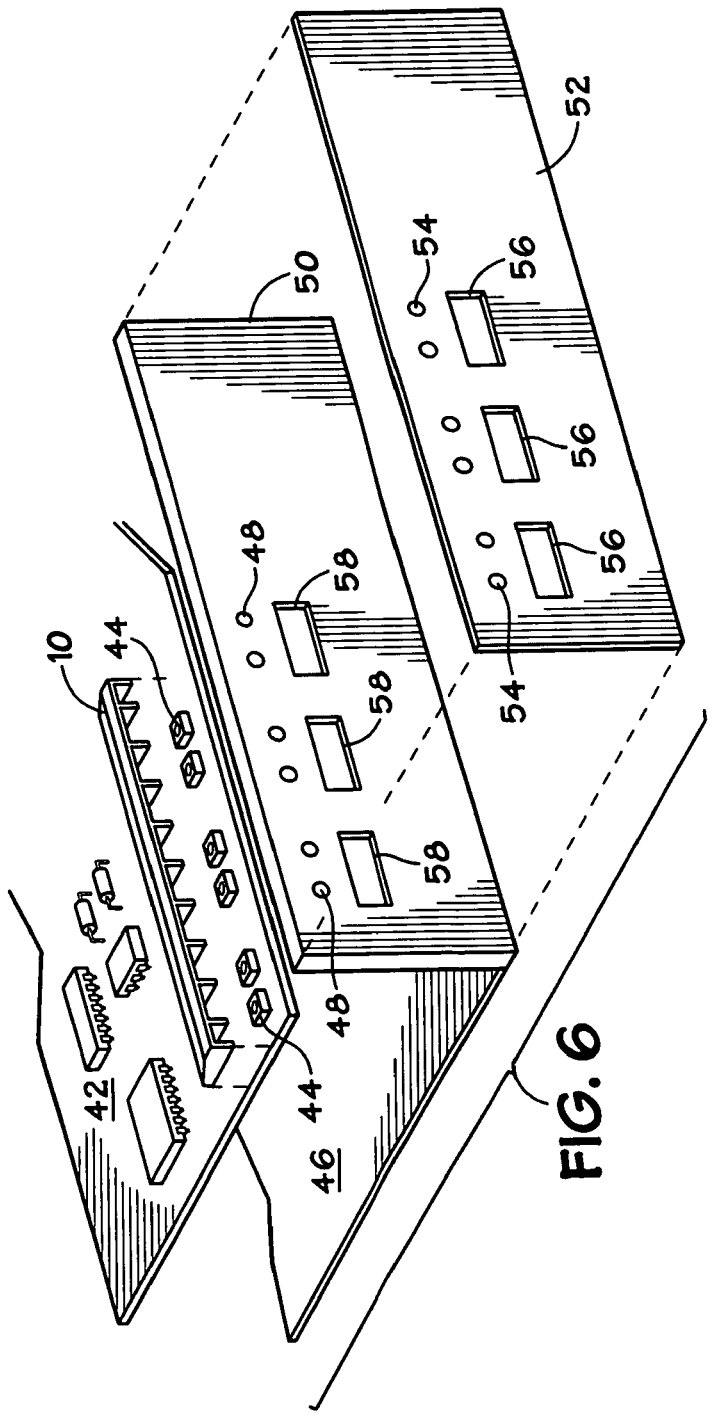
FIG. 6 is an exploded view of a device employing the light barrier illustrated in FIG. 1.

FIG. 6 is an exploded view of a device—e.g., a Fibre Channel switch—which employs the light barrier of the present invention to illuminate status indicators on its front panel. The illustrated device comprises chassis 46 having front portion 50. Printed circuit board 42 is housed within chassis 46. PCB 42 comprises a plurality of surface mount LEDs 44 in a generally linear array near the front edge of PCB 42. Light barrier 10 is positioned above the linear array of LEDs.

LEDs are available in packages designed for surface mount technology (SMT). This provides much more design freedom in allowing SMT LEDs to be economically placed directly onto circuit boards, with the viewed panel or indicator placed in a different location. There are a variety of different SMT styles, with a choice of J-wing, gull-wing, yoke-bend, and Z-bend leads. These surface mount LEDs are designed with flat top and sides for the ease of pick-and-place by automatic placement equipment. They are compatible with consecutive IR and vapor phase reflow soldering. Ceramic high-reliability LEDs are able to withstand the heat of wave soldering. Commercially available devices combine a red, blue, and green LED chip all into a single SMT package, making full-color displays possible.

Figure 7:
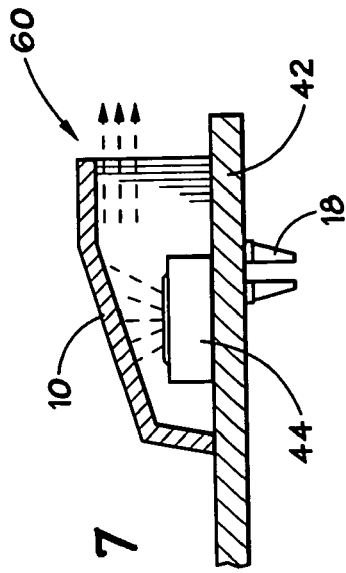
FIG. 7 is a partial cross sectional view showing the light barrier and a surface-mounted LED attached to a printed circuit board.

As illustrated in FIG. 7, light from surface mount LED 44 is emitted in a generally upward direction from PCB 42 upon which LED 44 is mounted. The emitted light reflects off the undersurface of light barrier 10 and exits the light barrier 10 as light rays 60.

Front panel 50 of chassis 46 may have receptacles 58 for receiving, for example, a network connector (not shown). Associated with each receptacle are one or more LEDs 44 for indicating the status of the connection. Front panel 50 has holes 48 which align with the individual compartments 15 in light barrier 10. Similarly, bezel 52 has lenses 54 which align with holes 48 and which, in some embodiments, may be optically dispersive to the light from LEDs 44 so as to provide a readily-observed, lighted indicator. Openings 56 in bezel 52 permit the insertion of connectors into receptacles 58.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A light reflector for PCB-mounted lights comprising:
   a segmented top having an interior surface and an exterior surface wherein each segment of the interior surface is generally planar and connected to the adjacent segment;
   a back wall having a top portion connected to the segmented top, a generally planar bottom portion and opposing side portions;

a pair of opposing side walls connecting the segmented top to the back wall;

a plurality of interior partitions defining a plurality of chambers open on their bottom surface and front surface said interior partitions connected on their top portion to the segmented top and connected on their rear portion to the back wall and having their bottom portions generally coplanar with the bottom of the back wall.

2. A light reflector as recited in claim 1 wherein the interior partitions are opaque.

3. A light reflector as recited in claim 1 wherein the segmented top, back wall and interior partitions are reflective to visible light.

4. A light reflector as recited in claim 3 wherein the segmented top, back wall and interior partitions are diffusely reflective to visible light.

5. A light reflector as recited in claim 1 wherein at least one segment of the segmented top is in a plane which is substantially parallel to the plane defined by the bottom portions of the interior partitions.

6. A light reflector as recited in claim 1 wherein at least one segment of the segmented top is in a plane which is at an acute angle to the plane defined by the bottom portions of the interior partitions.

7. A light reflector as recited in claim 1 wherein the segmented top, back wall, opposing side walls and interior partitions are formed of thermoplastic resin.

8. A light reflector as recited in claim 7 wherein the thermoplastic resin is a polycarbonate resin.

9. A light reflector as recited in claim 1 fabricated by the injection molding of a thermoplastic resin.

10. A light reflector as recited in claim 1 further comprising:

a generally planar support surface connected to and extending between a pair of adjacent interior partitions in a plane generally parallel to the plane defined by the bottom portions of the interior partitions;

a front wall connected to and extending between the support surface and the segmented top;

a mounting stud on the support surface for attaching the light reflector to a printed circuit board.

11. A light reflector as recited in claim 10 wherein the mounting stud comprises barbs for engaging a receiving hole in a printed circuit board.

12. A light reflector as recited in claim 10 wherein the mounting stud is threaded for receiving a similarly threaded nut.

13. A light reflector as recited in claim 10 wherein the mounting stud is generally cylindrical and comprised of a material which may be deformed at its distal end to provide a region of increased diameter.

14. An electronic device comprising:

a chassis having an interior space and a front surface for user interface; an indicator panel having a front face and a back face and mounted in the front surface of the chassis;

a plurality of windows in the indicator panel for transmitting light from the back face to the front face of the indicator panel;

a printed circuit board mounted in the interior space of the chassis such that one edge of the printed circuit board is proximate the indicator panel in the front surface of the chassis;

a plurality of light emitting diodes mounted on the printed circuit board in a generally linear array parallel to and proximate the edge of the printed circuit board which is proximate the indicator panel;

a light reflector mounted on the printed circuit board and comprising a segmented top having an interior surface and an exterior surface wherein each segment of the interior surface is generally planar and connected to the adjacent segment;

a back wall having a top portion connected to the segmented top, a generally planar bottom portion and opposing side portions;

a pair of opposing side walls connecting the segmented top to the back wall;

a plurality of interior partitions defining a plurality of chambers open on their bottom surface and front surface said interior partitions connected on their top portion to the segmented top and connected on their rear portion to the back wall and having their bottom portions generally coplanar with the bottom of the back wall;

the light reflector being mounted on the printed circuit board over the plurality of light emitting diodes in the linear array such that each light emitting diode in the array is separated from an adjacent light emitting diode in the array by at least one interior partition of the light reflector and light emitted by each light emitting diode is reflected by the light reflector to a corresponding window in the indicator panel.

15. A printed circuit board comprising:

a plurality of light emitting diodes mounted on the printed circuit board in a generally linear array parallel to and proximate at least one edge of the printed circuit board;

a light reflector mounted on the printed circuit board and comprising a segmented top having an interior surface and an exterior surface wherein each segment of the interior surface is generally planar and connected to the adjacent segment;

a back wall having a top portion connected to the segmented top, a generally planar bottom portion and opposing side portions;

a pair of opposing side walls connecting the segmented top to the back wall;

a plurality of interior partitions defining a plurality of chambers open on their bottom surface and front surface said interior partitions connected on their top portion to the segmented top and connected on their rear portion to the back wall and having their bottom portions generally coplanar with the bottom of the back wall;

the light reflector being mounted on the printed circuit board over the plurality of light emitting diodes in the linear array such that each light emitting diode in the array is separated from an adjacent light emitting diode in the array by at least one interior partition of the light reflector and light emitted by each light emitting diode is reflected by the light reflector in a direction which is substantially parallel to the surface of the printed circuit board.

16. A light reflector for PCB-mounted lights comprising:

a top, the cross section of which generally corresponds to a segment of a parabola;

a back wall having an upper edge connected to the top, a generally planar bottom edge and opposing side edges;

a pair of opposing side walls connecting the top to the back wall;

a plurality of interior partitions defining a plurality of chambers open on their bottom surface and front surface said interior partitions connected on their top portion to the top and connected on their rear portion to the back wall and having their bottom portions generally coplanar with the bottom edge of the back wall.

17. A light reflector as recited in claim 16 wherein the interior partitions are opaque.

18. A light reflector as recited in claim 16 wherein the top is reflective to light.

19. A light reflector as recited in claim 18 wherein the top is diffusely reflective to light.

20. A light reflector as recited in claim 16 wherein the interior partitions and undersurface of the top are reflective to light.

21. A light reflector as recited in claim 16 fabricated from a black, thermoplastic resin.

* * * * *